(12) United States Patent
Nosaka et al.

(10) Patent No.: US 8,467,689 B2
(45) Date of Patent: Jun. 18, 2013

(54) PARALLEL-SERIAL CONVERTER FOR OPTICAL TRANSMISSION, OPTICAL TRANSMISSION SYSTEM, AND ELECTRONIC APPARATUS

(75) Inventors: Tetsuya Nosaka, Ibaraki (JP); Kentaro Hamana, Kusatsu (JP); Naru Yasuda, Uji (JP); Hayami Hosokawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 186 days.

(21) Appl. No.: 13/055,746

(22) PCT Filed: Feb. 25, 2009

(86) PCT No.: PCT/JP2009/053438
§ 371 (c)(1),
(2), (4) Date: Jan. 25, 2011

(87) PCT Pub. No.: WO2010/021164
PCT Pub. Date: Feb. 25, 2010

(65) Prior Publication Data
US 2011/0123201 A1  May 26, 2011

(30) Foreign Application Priority Data
Aug. 22, 2008  (JP) .................. 2008-214605

(51) Int. Cl.
*H04B 10/04* (2006.01)
*H04B 10/00* (2006.01)
*H04B 1/00* (2006.01)
*H04B 10/12* (2006.01)

(52) U.S. Cl.
USPC ........... 398/182; 398/201; 398/141; 398/155; 375/238; 375/242; 375/327; 375/376

(58) Field of Classification Search
USPC .................................... 398/182, 201
See application file for complete search history.

(56) References Cited

U.S. PATENT DOCUMENTS 5,798,720 A * 8/1998 Yano ............................ 341/101
6,081,360 A   6/2000 Ishikawa et al.
(Continued)

FOREIGN PATENT DOCUMENTS

JP   2001-230678 A   8/2001
JP   2001-268039 A   9/2001
(Continued)

OTHER PUBLICATIONS

International Search Report issued in PCT/JP2009/053438, mailed on Apr. 7, 2009, with translation, 4 pages.
(Continued)

*Primary Examiner* — Shi K Li
*Assistant Examiner* — Oommen Jacob
(74) *Attorney, Agent, or Firm* — Osha Liang LLP

(57) ABSTRACT

A serializer is equipped with a plurality of input terminals into which a plurality of binary signals are input in parallel, and converts the plurality of input binary signals into serial binary signals and transmits the serial binary signals to an optical transmission module. One input terminal out of the plurality of input terminals is assigned as an input terminal for preventing bit continuation by inserting "1" signals or "0" signals into the serial binary signals so that a predetermined number of bits of the same value may not be inserted continuously. Due to this structure, bit continuation can be prevented even for a signal generating source with no coding function by a simple configuration without increasing cost and size.

15 Claims, 12 Drawing Sheets

U.S. PATENT DOCUMENTS

| | | | |
|---|---|---|---|
| 6,501,580 B1 * | 12/2002 | Ishikawa et al. | 398/148 |
| 2005/0063707 A1 * | 3/2005 | Imai | 398/141 |
| 2005/0286643 A1 * | 12/2005 | Ozawa et al. | 375/242 |
| 2007/0133663 A1 * | 6/2007 | Rensberger et al. | 375/152 |

FOREIGN PATENT DOCUMENTS

| | | |
|---|---|---|
| JP | 2005-064888 A | 3/2005 |
| JP | 2005-311523 A | 11/2005 |
| JP | 2006-114987 A | 4/2006 |

OTHER PUBLICATIONS

Office Action for European Application No. 09 808 100.3 dated Apr. 2, 2013 (6 pages).

* cited by examiner

Fig. 7

| Number of continuation bits | 7 | 9 | 11 | 13 | 15 |
|---|---|---|---|---|---|
| Output waveform on reception side | | | | | |
| Pass/fail determination | ○ | ○ | ○ | ○ | × |

# PARALLEL-SERIAL CONVERTER FOR OPTICAL TRANSMISSION, OPTICAL TRANSMISSION SYSTEM, AND ELECTRONIC APPARATUS

BACKGROUND OF THE INVENTION

1. Technical Field

The present invention relates to a parallel-serial converter for optical transmission, an optical transmission system, and an electronic apparatus.

2. Background Art

In recent years, higher data transmission speed between an LCD (Liquid Crystal Display) and an application processor is being demanded with higher definition of the LCD of the portable telephone. Furthermore, reduction in the number of wirings for data transmission is also being demanded with advancement in the thinning of the portable telephone. Based on such background, the serial transmission is beginning to be widely used as a data transmission method between the LCD and the application processor in place of the parallel transmission of the related art. However, in the conventional electrical wiring, there is a limit to increasing the transmission speed because smaller space of the wiring and electromagnetic interference (EMI) become significant. Thus, a method of connecting the LCD and the application processor with an optical transmission path such as a light waveguide and transmitting the data signal as an optical signal is considered.

The light waveguide has a dual structure including a center core called the core and a casing called the clad for covering the same, where the index of refraction of the core is higher than that of the clad. The optical signal that entered the core is propagated by repeating total reflection inside the core.

A schematic configuration of an optical transmission module including the optical transmission path will be described below using the drawing. FIG. 18 is a block diagram of a portion applied with the optical transmission module in a foldable portable telephone incorporating the optical transmission module.

An optical transmission module 100 includes a main control substrate (master side substrate) 20, and an application circuit substrate (slave side substrate) 30. The main control substrate 20 is mounted with a CPU 29. The application circuit substrate 30 is mounted with an LCD (Liquid Crystal Display), an LCD driver 39 for drive controlling the LCD, and various types of applications such as a camera module.

The main control substrate is connected with a light transmission processing section 2 including a light source drive circuit (light emission drive unit) and a light emitting unit (light emitting element; VCSEL (Vertical Cavity-Surface Emitting Laser). The slave side substrate 30 is connected with a light reception processing section 3 including a light receiving unit (light receiving element; PD (Photo-Diode)) and a reception (amplifier) IC. The optical transmission path 4 such as an optical fiber or a light waveguide having high bendability connects the light transmission processing section 2 with the light reception processing section 3 to transmit optical signals.

The mechanism of optical transmission in the optical transmission module 100 will now be briefly described. First, a light emission drive unit (driver) 22 drives the light emission of a light emitting unit 33 based on an electric signal input from the main control substrate 20 through an interface circuit (hereinafter referred to as I/F circuit) 21, so that the light emitting unit 23 irradiates a light incident surface of the optical transmission path 4 with light. The light applied on the light incident surface of the optical transmission path 4 is introduced into the optical transmission path 4, and exit from a light exit surface of the optical transmission path 4. The light exit from the light exit surface of the optical transmission path 4 is received by the light receiving unit 31, and converted to an electric signal after light reception is detected by a detection circuit 32. The converted electric signal is amplified to a desired value by an amplifier unit 33, and input to the LCD driver 39 or the like of the application circuit substrate 30 through an I/F circuit 34.

High speed and large capacity data transmission from the main control substrate mounted in the portable telephone to the application circuit substrate thus can be carried out by using such optical transmission module. The optical transmission module thus greatly excels as a data transmission module.

If the optical transmission module is applied to the electrical wiring I/F circuit for existing portable telephone as in the configuration described above, the low pass signal may not be easily transmitted due to the properties of the optical transmission module. In particular, when the continuing length of bits of the signal to be transmitted becomes long, the low pass properties of the transmitting signal extend. Thus, problems arise in introducing the optical transmission path as it is to the serial transmission by the electrical wiring of the related art.

For instance, Patent Document 1 discloses a configuration in which a coding unit for coding an output signal is arranged in the CPU 29 to add a coding function to prevent bit continuation of the transmitting signal (prevent transmission of low pass signal) in the optical transmission system. The 8B10B conversion is generally known for the coding function. The 8B10B conversion is an algorithm of data transmission coding in which the information of 8 bits are represented with a symbol (transmission character) of 10 bits. According to such 8B10B conversion, the value of "0" does not continue for a certain number or more in the transmitting signal.

However, the CPU 29 added with the coding function has a problem in that the power consumption, the size, and the cost increase. The configuration disclosed in Patent Document is thus not suited for practical use.

Furthermore, adopting the CPU 29 with no coding function to the optical transmission system is difficult because there is little IC commercial items having only the coding function. If in the IC commercial item having only the coding function the CPU 29 not added with the coding function is adopted in the optical transmission system, various problems such as increase in the power consumption of the optical communication IC, degradation in the signal waveform characteristics, and adjustment of sequence timing arise, and thus it is not suitable for practical use.

Patent Document 1: Japanese Unexamined Patent Publication No. 2001-230678

DISCLOSURE OF THE INVENTION

One or more embodiments of the present invention provide a parallel-serial converter for optical transmission, an optical transmission system, and an electronic apparatus capable of preventing continuation of bits even in a signal generating source (CPU) with no coding function with a simple configuration without increasing cost and size.

In accordance with one or more embodiments of the present disclosure, there is provided a parallel-serial converter for optical transmission, including a plurality of input terminals into which a plurality of binary signals are input in parallel, for converting the plurality of input binary signals to serial binary signals and transmitting the signals to an optical transmission module, wherein an input terminal for preventing bit continuation for inserting "1" signals or "0" signals into the serial binary signals so that the same value does not continue for a predetermined number of bits is assigned to the plurality of input terminals.

According to the above configuration, the input terminal for preventing bit continuation is assigned in advance to a plurality of input terminals to which a plurality of binary signals are input in parallel in the parallel-serial converter for optical transmission. The relevant input terminal for bit continuation inserts the "1" signals or the "0" signals so that the same value does not continue for a predetermined number of bits in the serial binary signal transmitted to the optical transmission module. Thus, according to the above configuration, the serial binary signal has the continuing number of the same bits limited.

In accordance with one or more embodiments of the present disclosure, there is provided an optical transmission system including: a signal generation unit for outputting a plurality of binary signals in parallel; a parallel-serial converter for optical transmission according to claim 1 for receiving the plurality of binary signals and converting the received binary signals to serial binary signals; and an optical transmission module including an optical converter for converting the serial binary signals output from the parallel-serial converter for optical transmission to optical signals, and transmitting the optical signals converted by the optical converter through an optical transmission path.

In the above-described configuration, continuing bits are dealt with by simply assigning the input terminal for preventing bit continuation to the plurality of input terminals of the parallel-serial converter for optical transmission, and hence the continuing bits can be avoided with a simple configuration without increasing the cost, the size, and the power consumption compared to the configuration in which the coding unit is arranged such as Patent Document 1.

The optical transmission system capable of avoiding continuing bits with a simple configuration without increasing the cost, the size, and the power consumption compared to the configuration in which the coding unit is arranged such as Patent Document 1 is realized.

The electronic apparatus of one of more embodiments of the present disclosure includes the above-described optical transmission system.

Thus, the continuing bits can be avoided without increasing the cost, the size, and the power consumption compared to the configuration in which the coding unit is arranged such as Patent Document 1. Furthermore, the optical transmission system by the optical transmission module can be applied to the electronic apparatus with a simple configuration. Furthermore, the drawing of wiring of the mounted substrate in the electronic apparatus can be simplified and the space inside the electronic apparatus can be saved by applying the optical transmission system of one or more embodiments of the present invention to the electronic apparatus.

Other characteristics and excelling aspects of one or more embodiments of the present invention should become apparent from the description given below.

BRIEF DESCRIPTION OF THE DRAWINGS

FIG. 5(a) shows the serial signal pattern in the optical transmission system of the related art, and FIG. 5(b) shows the serial signal pattern in the optical transmission system 100 of the present embodiment.

FIG. 7 is a view showing the results of verifying whether or not an error rate specification of a transmission standard is met when the continuing number of continuation bits is smaller than 15 (limiting number).

DETAILED DESCRIPTION

Figure 1:
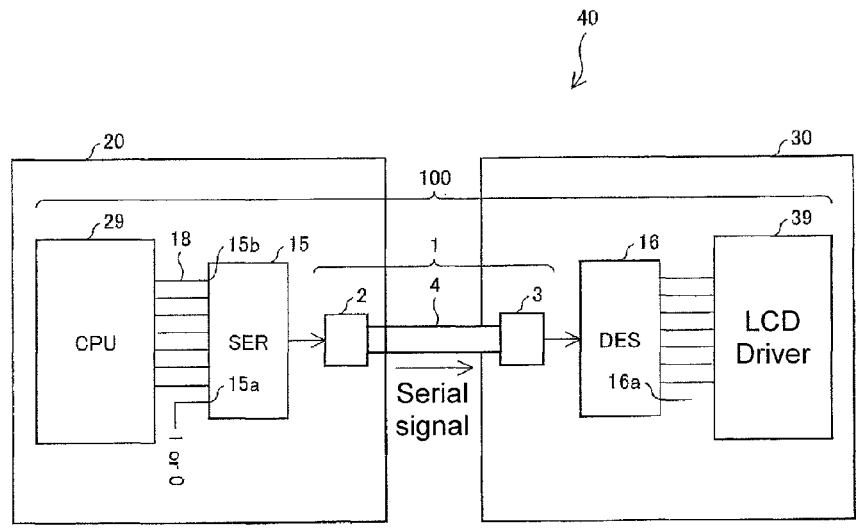
FIG. 1 is a block diagram showing a schematic configuration of an optical transmission system arranged in a foldable portable telephone according to the present embodiment.
Figure 2:
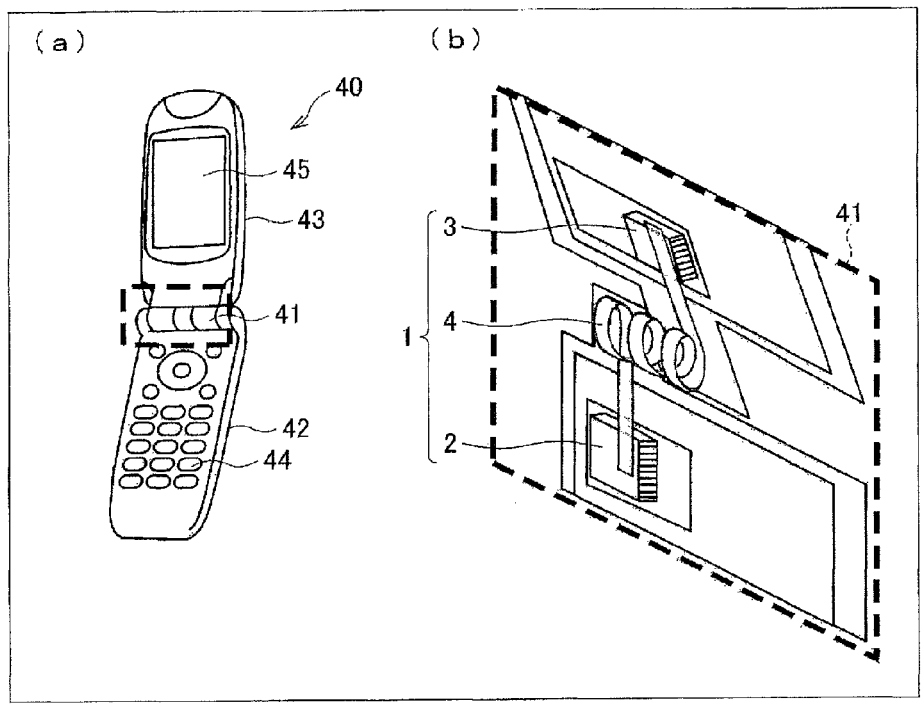
FIG. 2(a) is a perspective view showing an outer appearance of a foldable portable telephone 40 incorporating an optical transmission module 1 of the present embodiment.
FIG. 2(b) is a transparent plan view of a hinge (portion surrounded with a broken line) in FIG. 2(a).

One or more embodiments of the present invention will be described below based on FIG. 1 to FIG. 17.
Description of Symbols
1 optical transmission module
2 light transmission processing section
21 I/F circuit
22 light emission drive unit
23 light emitting unit
29 CPU (signal generation unit)
3 light reception processing section
31 light receiving unit
32 detection circuit
33 amplifier unit
34 I/F circuit
4 optical transmission path
5 electric transmission path
15 serializer
15a input terminal for preventing bit continuation
15b data input terminal
16 deserializer
100 optical transmission system The present embodiment describes a configuration of carrying out information (data) transmission between a main body and a lid through an optical transmission module arranged in a hinge in a foldable portable telephone, which includes the main body with operation keys, the lid with a display screen, and the hinge for rotatably connecting the lid to the main body.

FIG. 1 is a block diagram showing a schematic configuration of an optical transmission system 1 arranged in a foldable portable telephone 40 of the present embodiment. FIG. 2(a) is a perspective view showing an outer appearance of the foldable portable telephone 40 incorporating an optical transmission module 1 of the present embodiment. FIG. 2(b) is a transparent plan view of a hinge 41 (portion surrounded with a broken line) in FIG. 2(a).

As shown in FIG. 1 and FIGS. 2(a) and 2(b), the foldable portable telephone 40 (hereinafter simply shown as portable telephone 40) according to the present embodiment is configured by a main body 42, a hinge 41 arranged at one end of the main body 42, and a lid 43 rotatably arranged with the hinge 41 as a shaft.

The main body 42 includes an operation key 44 for operating the portable telephone 40, and internally includes a main control substrate 20. The lid 43 externally includes a display screen 45 and a camera (not shown) and internally includes an application circuit substrate 30. A driver 39, and the like are mounted thereon.

In the portable telephone 40 having the above configuration, the information (data) transmission between the main control substrate 20 and the application circuit substrate is carried out through the optical transmission module 1.

As shown in FIG. 1, the main control substrate 20 on the main body 42 side includes a CPU (signal generation unit) 29 for comprehensively controlling each element (not shown) mounted on the substrate 20, and a serializer 15 serving as a serial/parallel converter. The serializer (P/S converter) 15 converts a parallel signal (hereinafter referred to as parallel signal) to a serial signal (hereinafter referred to as serial signal).

The application circuit substrate 30 includes an LCD (Liquid Crystal Display) (not shown) for displaying images based on image data (binary signal) transferred from the CPU 29, an LCD driver (control unit) 39 serving as a drive unit for drive controlling the LCD, and a deserializer 16 serving as a serial/parallel converter. The deserializer 16 converts the serial signal to a parallel signal.

Figure 3:
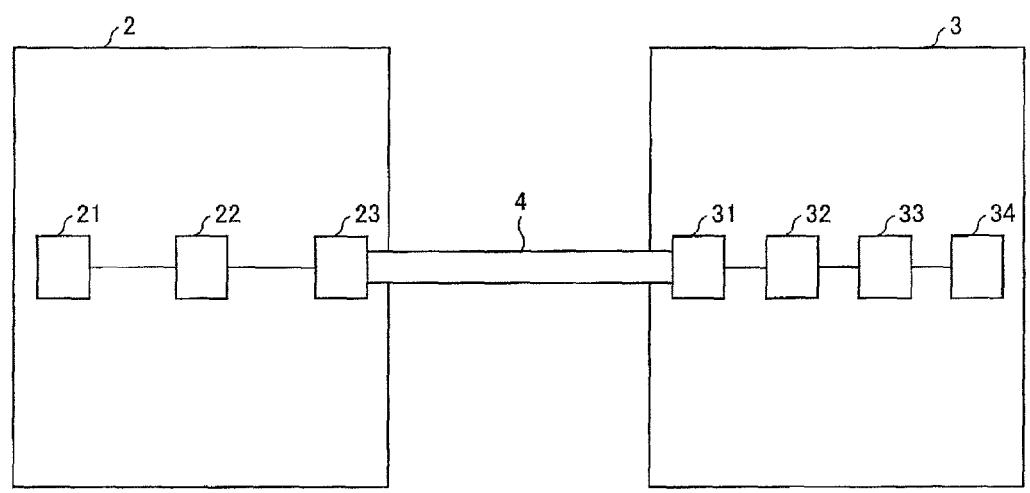
FIG. 3 is a block diagram showing a schematic configuration of the optical transmission module in the portable telephone according to the present embodiment.
Figure 4:
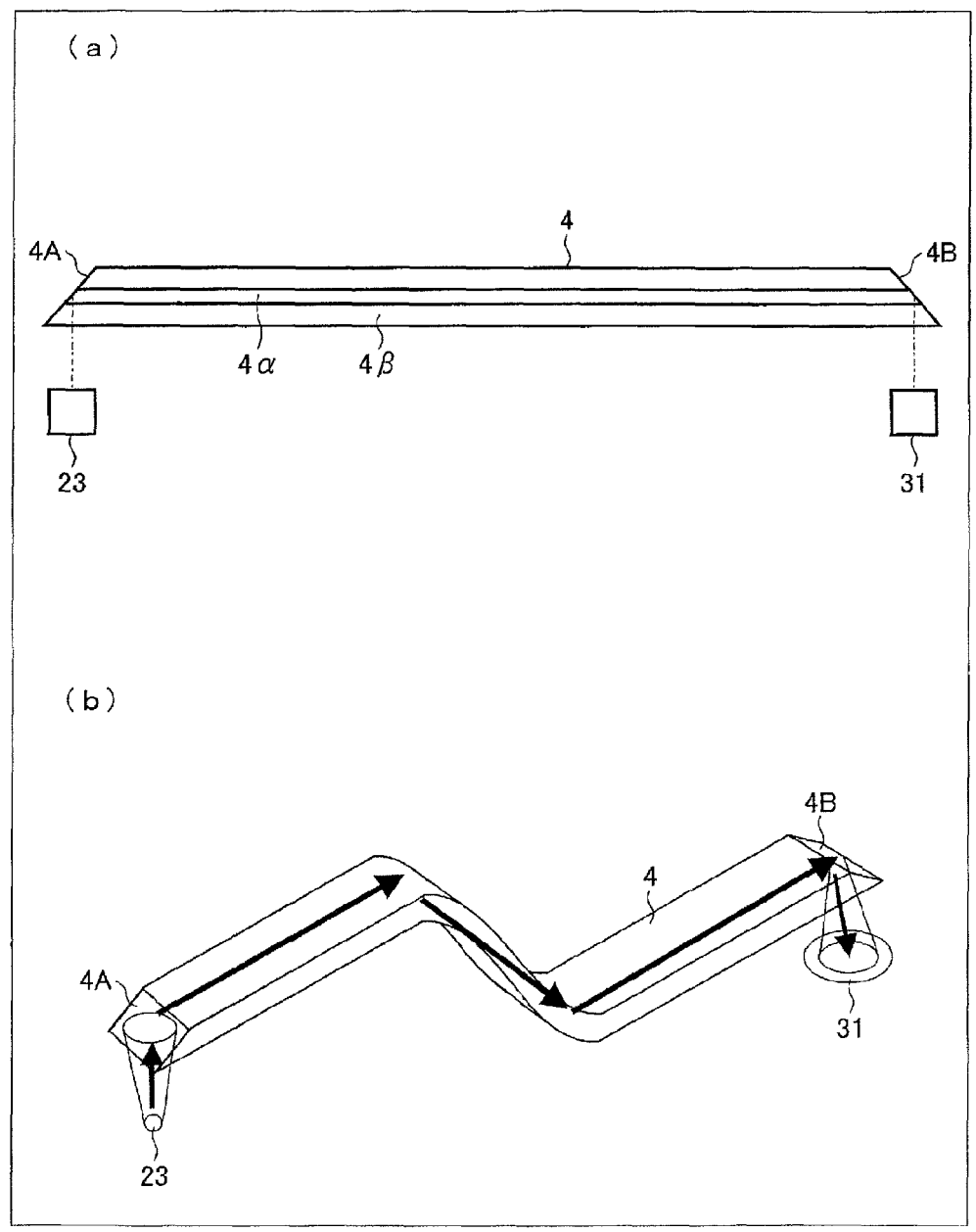
FIG. 4(a) is a side view of the optical transmission path.
FIG. 4(b) is a perspective view schematically showing a state of light transmission in the optical transmission path.

(Configuration of Optical Transmission Module)
The configuration of the optical transmission module 1 will now be described with reference to FIG. 1 and FIG. 3. FIG. 3 is a block diagram showing a schematic configuration of the optical transmission module 1 in the portable telephone 40 according to the present embodiment.

As shown in FIG. 1 and FIG. 3, the optical transmission module 1 is configured to include a light transmission processing section 2 connected to the main control substrate 20 mounted with the CPU 29, a light reception processing section 3 connected to the application circuit substrate 30 mounted with an application circuit such as the LCD driver 39, and an optical transmission path 4 that becomes an optical wiring for connecting the light transmission processing section 2 and the light reception processing section 3.

The optical transmission path 4 is a medium for transmitting an optical signal serving as a data signal emitted from the light emitting unit 23 to the light receiving unit 31. The details of the optical transmission path 4 will be described later.

As shown in FIG. 3, the light transmission processing section 2 is configured to include an interface circuit (hereinafter referred to as I/F circuit) 21, a light emission drive unit (light converter) 22, and a light emitting unit 23.

The I/F circuit 21 is a circuit for externally receiving signals having different frequency levels. The I/F circuit 21 is arranged between an electrical wiring of an electric signal input to the optical transmission module 1 from the outside and the light emission drive unit 22.

The light emission drive unit 22 drives the light emission of the light emitting unit 23 based on the electric signal input to the optical transmission module 1 from the outside through the I/F circuit 12. The light emission drive unit 22 can be configured by an IC (Integrated Circuit) for light emission drive.

The light emitting unit 23 emits light based on the drive control by the light emission drive unit 22. The light emitting unit 23 can be configured by a light emitting element such as a VCSEL (Vertical Cavity-Surface Emitting Laser). The light emitted from the light emitting unit 23 is applied to an end on the light incident side of the optical transmission path 4 as an optical signal.

The light transmission processing section 2 thus converts the electric signal input to the light transmission processing section 2 to the optical signal corresponding to such electric signal, to output the converted electric signal to the optical transmission path 4.

The light reception processing section 3 is configured to include a light receiving unit 31, a detection circuit 32, an amplifier unit 33, and an I/F circuit 34.

The light receiving unit 31 receives light serving as the optical signal emitted from an end on the light exit side of the optical transmission path 4, and outputs an electric signal through photoelectric conversion. The light receiving unit 31 can be configured by a light receiving element such as a PD (Photo-Diode). The detection circuit 32 determines whether or not the light receiving unit 31 received the optical signal.

The amplifier unit 33 amplifies the electric signal output from the light emitting unit 31/detection circuit 32 to a desired value to output the amplified electric signal to the outside. The amplifier unit 33 can be configured by an amplification IC, and the like.

The I/F circuit 34 is a circuit for outputting the electric signal amplified by the amplifier unit 33 to the outside of the optical transmission module 1. The I/F circuit 34 is connected to the electrical wiring for transmitting electric signals to the outside, and is arranged between the amplifier unit 32 and the electrical wiring.

The light reception processing section 3 thus can receive the optical signal output from the light transmission processing section 2 through the optical transmission path 4, convert the optical signal to the electric signal corresponding to the relevant optical signal, amplify the converted optical signal to a desired signal value to output the same to the outside.

(Configuration of Optical Transmission Path)

The details of the optical transmission path 4 will be described using FIG. 4(a) and FIG. 4(b). FIG. 4(a) shows a side view of the optical transmission path 4. As shown in the figure, the optical transmission path 4 is configured to include a column-shaped core portion 4α having the light transmitting direction as an axis, and a clad portion 4β arranged to surround the periphery of the core portion 4α. The core portion 4α and the clad portion 4β are made from a material having translucency, where the index of refraction of the core portion 4α is higher than the index of refraction of the clad portion 4β. The optical signal that entered the core portion 4a is thus transmitted in the light transmitting direction by repeating total reflection inside the core portion 4α.

The material for configuring the core portion 4α and the clad portion 4β may be glass or plastic, but is preferably a resin material such as acryl type, epoxy type, urethane type, and silicone type in order to configure the optical transmission path 4 having sufficient flexibility. The clad portion 4β may be configured by gas such as air. Furthermore, similar effects can be obtained even if the clad portion 4β is used in an atmosphere of liquid having a smaller index of refraction than the core portion 4α.

The mechanism of optical transmission by the optical transmission path 4 will be described using FIG. 4(b). FIG. 4(b) schematically shows a state of optical transmission in the optical transmission path 4. As shown in the figure, the optical transmission path 4 is configured by a column-shaped member having flexibility. A light incident surface 4A is provided at the end on the light incident side of the optical transmission path 4, and a light exit surface 4B is provided at the end on the light exit side.

The light emitted from the light emitting unit 23 enters the end on the light incident side of the optical transmission path 4 from a direction perpendicular to or substantially perpendicular to the light transmitting direction of the optical transmission path 4. The incident light is guided into the optical transmission path 4 by being reflected at the light incident surface 4A, and advances through the core portion 4α. The light that advanced through the optical transmission path 4 and reached the end on the light exit side is reflected at the light exit surface 4B, and exit in the direction perpendicular to or substantially perpendicular to the light transmitting direction of the optical transmission path 4. The light receiving unit 31 is irradiated with the exit light, and photoelectric conversion is carried out in the light receiving unit 31.

According to such configuration, the light emitting unit 23 serving as a light source can be arranged in the direction perpendicular to or substantially perpendicular to the light transmitting direction in the optical transmission path 4. Thus, when the optical transmission path 4 needs to be arranged parallel to a substrate surface, the light emitting unit 23 may be installed between the optical transmission path 4 and the substrate surface so as to emit the light in the normal direction of the substrate surface. Such configuration is easier to mount than the configuration in which the light emitting unit 23 is installed so as to emit the light parallel to the substrate surface, and can be more reduced in size as a configuration. This is because the size in the direction perpendicular to the direction of emitting light is greater than the size in the direction of emitting light in the general configuration of the light emitting unit 23. Furthermore, application can be made even to the configuration that uses a light emitting element for plane mounting in which an electrode and the light emitting unit 23 are in the same plane.

The optical transmission path 4 shown in the figure has a configuration in which the light incident surface 4A and the light exit surface 4B are inclined, as described above, but the optical transmission path 4 according to the present embodiment may have a configuration in which both end faces are orthogonal to the light transmitting direction. That is, the outer shape of the optical transmission path 4 may be formed to a solid rectangular shape.

(Optical Transmission System 100)

The information transmission between the main body 42 and the lid 43, that is, between the main control substrate 20 and the application circuit substrate 30 will be described below using FIG. 1 and FIG. 3.

In the optical transmission system 100 through the optical transmission module 1, data communication of a parallel signal (parallel binary signal) is carried out in the CPU 29 and the LCD driver 39, and data communication of a serial signal (serial binary signal) is carried out in the optical transmission path 4. A case in which the CPU 29 transfers the image data to the LCD driver 39 to display the image on the LCD (not shown) will be described as an example of data communication. The CPU 29 outputs the image data signal of the image to display on the LCD in a parallel signal. The image data signal output from the CPU 29 is input to the serializer (parallel-serial converter for optical transmission) 15.

The serializer 15 converts the image data signal (data) output from the CPU 29 to a serial signal (serial binary signal), and outputs the converted image data signal to the light transmission processing section 2. The image data signal (data) converted to a serial signal is input to the light emission drive unit 22 through the I/F circuit 21 of the light transmission processing section 2. The light emitting unit 23 emits light when the light emission drive unit 22 drives the light emitting unit 23. The light exit from the light emitting unit 23 is transmitted to the light reception processing section 3 through the optical transmission path 4.

The light receiving unit 31 of the light reception processing section 3 receives the light of the optical signal of the image data signal (data) transmitted through the optical transmission path 4, converts the same to an electric signal through photoelectric conversion, and outputs the electric signal to the detection circuit 32. The detection circuit 32 determines whether or not the light receiving unit 31 received the optical signal based on the electric signal, and outputs the electric signal of the image data signal (data) to the amplifier unit 33. The amplifier unit 33 amplifies the electric signal of the image data signal (data), and outputs the amplified electric signal to the deserializer 16 through the I/F circuit 34.

The deserializer 16 converts the image data signal (data) or the serial signal transmitted from the main control substrate 20 side to a parallel signal, and inputs the same to the LCD driver 39.

The light reception processing section 3 is not limited to the processing section capable of receiving the serial signal as described above. The light reception processing section 3 may receive only the parallel signal. In this case, a configuration in which the deserializer for converting the serial signal transmitted through the optical transmission path 4 to the parallel signal is arranged inside the light reception processing section 3 or outside the light reception processing section 3 may be adopted.

The LCD driver 39 performs write of the image data based on the image data signal (data), and performs the display control of the LCD (not shown). The LCD (not shown) displays the image based on the image data transmitted from the CPU 29 according to the control of the LCD driver 39.

Figure 5:
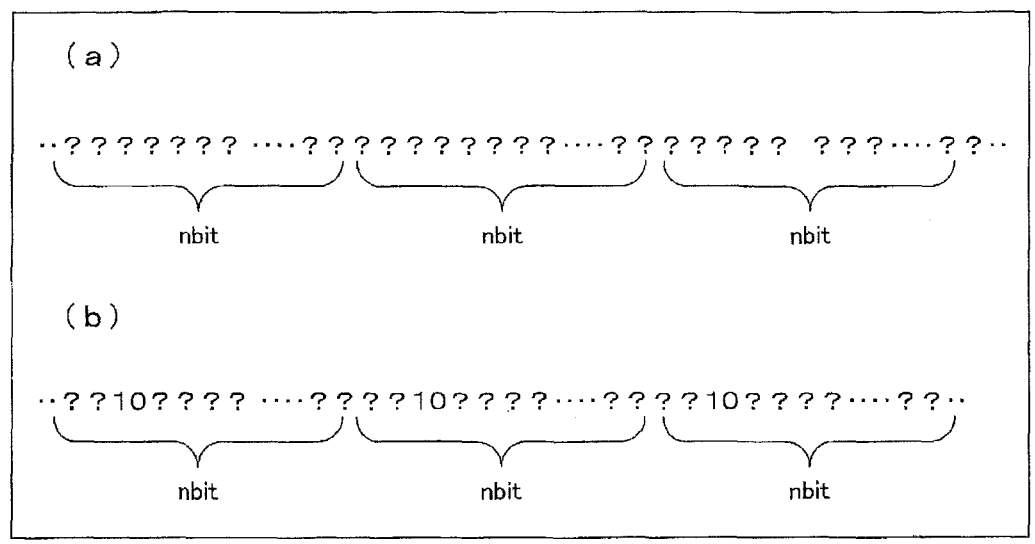
FIG. 5 is a schematic view showing a signal pattern of the serial signal to be transmitted through the optical transmission path of the optical transmission module, where

The optical transmission system 100 according to the present embodiment has characteristics in converting the parallel signal output from the CPU 29 to a serial signal through the serializer 15. FIG. 5 is a schematic view showing a signal pattern of the serial signal to be transmitted through the optical transmission path of the optical transmission module, where FIG. 5(a) shows the serial signal pattern in the optical transmission system of the related art, and FIG. 5(b) shows the serial signal pattern in the optical transmission system 100 of the present embodiment.

"?" shown in FIG. 5(a) and FIG. 5(b) takes the value of "0" or the value of "1" according to the parallel signal input to the serializer 15, and the signal of different values is input. If the number of input terminals for the parallel signal input to the serializer 15 is b, the serial signal transmitted through the optical transmission path repeats the signal pattern of n bits (n≧b). That is, even when the number of input terminals for the parallel signal is b, the signal output from the serializer 15 is added with signals of parity check function and the like and becomes n bits depending on the serializer 15.

As shown in FIG. 5(a), the signal pattern of n bits that differs according to the input parallel signal is repeated in the serial signal transmitted through the optical transmission path in the optical transmission system of the related art. Thus, continuing bits in which the value of "0" or the value of "1" infinitely continues may occur depending on the signal pattern. A coding unit for coding the serial signal to be transmitted through the optical transmission path is arranged in the technique of Patent Document 1.

In the optical transmission system 100 of the present embodiment, on the other hand, an input terminal for preventing bit continuation (dummy bit) 15a is assigned to the input terminal of the serializer 15 in advance. Thus, the continuation of the value of "0" and the value of "1" ("10" or "01") is inserted to the serial signal transmitted through the optical transmission path for every predetermined bits (n bits), as shown in FIG. 5(b). The continuing number of the same bit is thus limited in the serial signal.

In the optical transmission system 100, the continuation of the value of "0" and the value of "1" is assigned in advance for every predetermined bit with respect to the serial signal transmitted through the optical transmission path. Thus, the continuing bits can be avoided with a simple configuration without increasing the cost, the size, and the power consumption compared to the configuration in which the coding unit is arranged as Patent Document 1.

(Definition of Limiting Number of Bit Continuation of Serial Signal Transmitted Through Optical Transmission Path)

Figure 6:
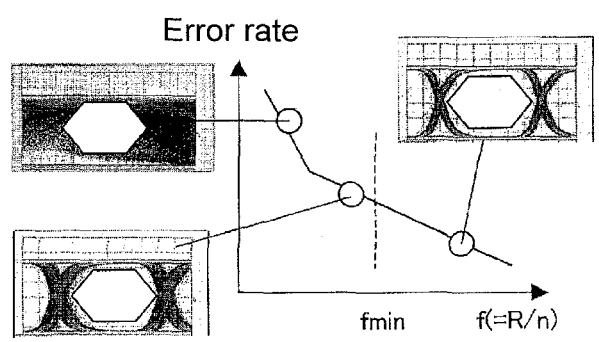
FIG. 6 is a graph showing a relationship of the signal transmission rate and the error rate in the optical transmission module.

The signal transmission of the optical transmission module 1 is subjected to restriction of band characteristics of the optical communication IC (IF circuit 21, light emission drive unit 22, detection circuit 32, amplifier unit 33, I/F circuit 34) mounted on the module, and has a limit value for the signal transmission rate (hereinafter referred to as transmissible rate fmin). If the signal transmission rate of the optical transmission module 1 is lower than the transmission rate other than that of the specification, that is, if the signal transmission rate of the optical transmission module 1 is smaller than or equal to the transmissible rate fmin, drawbacks shown in FIG. 6 arise. FIG. 6 is a graph showing the relationship of the signal transmission rate and the error rate in the optical transmission module 1. The waveform chart shown in the figure shows the waveform of the signal output from the light reception processing section 3 of the optical transmission module 1, where the hexagonal region indicates the standard of the error rate. In other words, if the waveform shown in the waveform chart is superimposed on the hexagonal region, the error rate specification of the transmission standard is not met and the signal transmission rate degrades. The region indicating the standard of the error rate is called a mask pattern. The mask pattern is not limited to a hexagon shown in FIG. 6 and can be appropriately set according to the standard of the error rate. For instance, the mask pattern may be a diamond shape other than the hexagonal shape shown in FIG. 6.

As shown in the figure, if the signal transmission rate of the optical transmission module 1 is smaller than or equal to the transmissible rate fmin, the waveform of the signal output from the light reception processing section 3 is superimposed or partially superimposed on the hexagonal region, so that the error rate rises. If the signal transmission rate is greater than the transmissible rate fmin, the waveform of the signal output from the light reception processing section 3 does not superimpose on the hexagonal region, the error rate specification of the transmission standard is met, and the error rate is reduced.

Even if the signal transmission rate of the optical transmission module 1 is the same, when the "0" signal or the "1" signal is continuously input to the module, this case consequently becomes the same as the case where the low pass signal is input to the module. Thus, the error rate rises when the "0" signals or the "1" signals are continuously input to the module.

The number of continuing bits n of the serial signal transmitted through the optical transmission path 4 is defined based on the transmissible rate fmin in the optical transmission system 100. In considering the case where the "0" signals or the "1" signals are continuously input to the module, the signal transmission rate f of the optical transmission module is R/n (where R is the signal transmission rate of the serial signal output from the serializer 15).

In other words, in the optical transmission system 100, the input terminal for preventing bit continuation is assigned to the input terminal portion of the serializer 15 so that the number of bit continuation n satisfies equation (1)

$$N < R/fmin \quad (1)$$

with respect to the serial signal transmitted through the optical transmission path 4, where fmin is the minimum value of the signal transmission rate of the optical transmission module 1 and R is the signal transmission rate of the serial signal output from the serializer 15.

The result of conducting a verification experiment on the limiting number R/fmin of bit continuation calculated based on equation (1) will be described below. The conditions of the signal transmission rate R and the transmissible rate fmin in the verification experiment are as follows.

Signal transmission rate R: 450 Mbit/s
Transmissible rate fmin; 30 Mbit/s (low pass cut-off frequency; 6 MHz)
The transmissible rate fmin is sometimes specified with the expression of the low pass cut-off frequency of the optical transmission module 1. The relevance of the transmissible rate fmin and the low pass cut-off frequency will be described later.

The limiting number of bit continuation calculated with the conditions of the signal transmission rate R and the transmissible rate fmin is 15 bits. When the continuation number n of the continuing bits is actually smaller than 15 (limiting number), whether or not the error rate specification of the transmission standard is met was verified. The verification result is shown in FIG. 7.

When the signal in which the number of continuing bits is 7, 9, 11, 13, 14 is input to the optical transmission module 1, whether or not the waveform of the signal output from the light reception processing section 3 satisfies the error rate specification of the transmission standard was verified. As shown in FIG. 7, it can be seen that the error rate specification of the transmission standard is met and the signal transmission by the optical transmission module 1 is satisfied when a signal in which the number of continuing bits is smaller than 13 is input to the optical transmission module 1. The error rate specification of the transmission standard is not met and the signal transmission rate is degraded when a signal in which the number of continuing bits is 15 is input to the optical transmission module 1.

According to the above verification result, it can be seen that the error rate specification of the transmission standard is met and the signal transmission by the optical transmission module 1 is satisfied if the number of bit continuation n is limited so as to satisfy the following equation (1)

$$N < R/fmin \qquad (1)$$

In the optical transmission system 100, the number of input terminals for preventing bit continuation that can be assigned is sometimes limited due to the relationship between the number of parallel signals output from the CPU 29 and the number of input terminals of the serializer 15. In such a case, the assigning number of the input terminal for preventing bit continuation can be ensured by limiting the number of bit continuations n as described above.

If the assigning number of the input terminal for preventing bit continuation becomes relatively large, the signal from the input terminal for preventing bit continuation is added to the serial signal necessary for the transmission of image data. The signal transmission rate of the optical transmission module 1 increases by the added signal, and the power consumption consequently increases. The increase in the power consumption by the signal from the input terminal for preventing bit continuation can be prevented by limiting the number of bit continuations n in the above manner.

Figure 8:
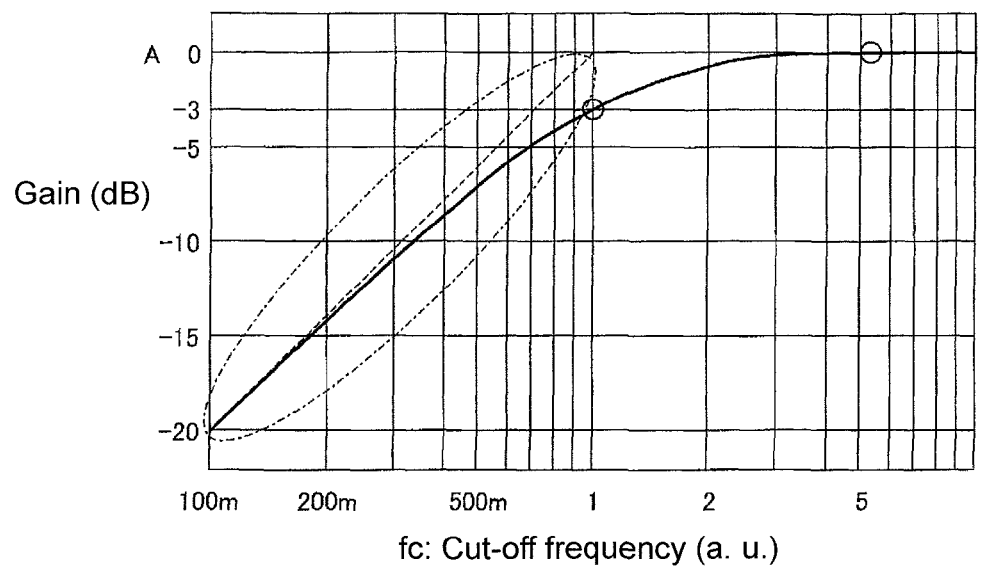
FIG. 8 is a graph showing a frequency characteristics of a gain in the optical transmission module and showing a relationship of the frequency and the gain.

The transmissible rate fmin is sometime specified with the expression of the low pass cut-off frequency of the optical transmission module 1, as mentioned above. The relevance of the transmissible rate fmin and the low pass cut-off frequency will be described based on FIG. 8. FIG. 8 is a graph showing the frequency characteristics of the gain in the optical transmission module 1, and shows the relationship of the frequency and the gain.

In the figure, the low pass cut-off frequency is defined as a frequency when the gain changed by −3 dB on the low pass frequency side compared to the portion where the frequency characteristics is flat (portion that is constant without being dependent on the frequency).

The relationship of the transmissible rate fmin of the optical transmission module 1 and the low pass cut-off frequency is shown in equation (2) below.

Transmissible rate fmin =low pass cut-off frequency×m

Here, m is determined by the filter configuration for determining the low pass cut-off frequency characteristics in the optical communication IC mounted on the optical transmission module 1.

When the filter configuration is one order, m≈5 is obtained, where m becomes the largest. Many optical communication ICs adopt a one-order filter configuration. In this case, the limiting number of the continuing bits becomes the largest. When the filter configuration is two-orders, m>5 is obtained, and the slope of the gain with respect to the frequency becomes steep. The few of the optical communication ICs adopt the two-order filter configuration.

A specific configuration of the input terminal for preventing bit continuation assigned to the serializer 15 will be described below based on FIG. 1.

As shown in FIG. 1, the input terminal portion of the serializer 15 includes an input terminal for preventing bit continuation 15a and an input terminal 15b. The input terminal 15b is connected to an input signal line 18. The input signal line 18 is a signal line for parallel transmitting from the CPU 29 to the serializer 15. The input terminal for preventing bit continuation 15a is assigned separate from the input terminal 15b. The input terminal for preventing bit continuation 15a receives a signal having a voltage level being always LOW level or receives a signal having a voltage level being always HIGH level. Whether the input signal is "0" signal or "1" signal is determined according to the voltage level of the signal input to the input terminal for preventing bit continuation 15a.

According to such configuration, if the number of inputs of the parallel signal input to the serializer 15 is m, the serial signal transmitted through the optical transmission path 4 becomes a signal in which the "0" signal or the "1" signal is repeated for every m bits, so that the continuing bits can be avoided.

The serial signal transmitted through the optical transmission path 4 is converted to the parallel signal in the deserializer 16. The signal from the input terminal for preventing bit continuation 15a is input to a terminal 16a of the deserializer 16. As shown in FIG. 1, the terminal 16a and the LCD driver 39 are not connected, and the signal from the input terminal for preventing bit continuation 15a is not input to the LCD driver 39.

The number of input terminal for preventing bit continuations 15a is appropriately set according to the number of input terminals 15b assigned to the input terminal portion of the serializer 15, the design of the optical transmission system 100, and the like.

A first input terminal for preventing bit continuation that constantly receives the signal of value of "1" and a second input terminal for preventing bit continuation that constantly receives the signal of value of "0" may both be assigned to the input terminal portion of the serializer 15 as the input terminal for preventing bit continuation 15a. FIG. 9(a) is a block diagram showing a configuration in which the first input terminal for preventing bit continuation and the second input terminal for preventing bit continuation are both assigned, and FIG. 9(b) is a conceptual view showing a serial signal pattern when the first input terminal for preventing bit continuation and the second input terminal for preventing bit continuation are both assigned.

Figure 9:
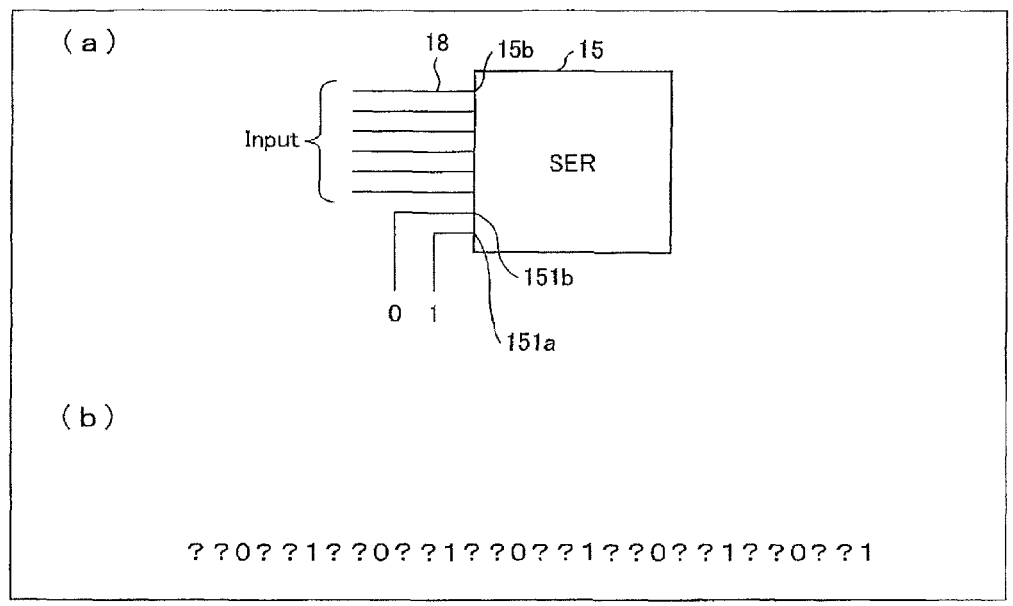
FIG. 9(a) is a block diagram showing a configuration in which a first input terminal for preventing bit continuation and a second input terminal for preventing bit continuation are both assigned.
FIG. 9(b) is a conceptual view showing a serial signal pattern when the first input terminal for preventing bit continuation and the second input terminal for preventing bit continuation are both assigned.

As shown in FIG. 9(a), an input terminal for preventing bit continuation 151a (first input terminal for preventing bit continuation) and an input terminal for preventing bit continuation 152a (second input terminal for preventing bit continuation) are both assigned to the input terminal portion of the serializer 15. According to such configuration, the serial signal transmitted through the optical transmission path 4 becomes a signal in which the value of "0" and the value of "1" are alternately and periodically inserted, as shown in FIG. 9(*b*). Thus, the number of continuing bits of value of "0" or value of "1" in the serial signal can be reduced with the minimum assigning number of input terminal for preventing bit continuation.

In FIG. 9(*a*), a configuration in which the first input terminal for preventing bit continuation 151*a* and the second input terminal for preventing bit continuation 152*a* are adjacent is shown. However, the first input terminal for preventing bit continuation 151*a* and the second input terminal for preventing bit continuation 152*a* are not limited to the configuration of FIG. 9(*a*), and may be spaced apart.

In view of the relationship between the number of input terminals of the serializer 15 and the number of parallel signals to be input, the input terminal for preventing bit continuations 151*a*, 152*a* are preferably at equal distance from each other and assigned so as to be alternate when the assigning number of the input terminals for preventing bit continuations 151*a*, 152*a* is limited. For instance, if the number of input terminals of the serializer 15 is 30 and the assignable number of terminals of the input terminals for preventing bit continuation 151*a*, 152*a* is 3, the input terminals for preventing bit continuations 151*a*, 152*a* are preferably alternately assigned to the first, eleventh, and twenty-first input terminals. With such configuration, the number of continuing bits of value of "0" and value of "1" in the serial signal can be effectively reduced.

If great number of input terminal for preventing bit continuations are assigned, the transmission rate of the serial signal increases by the assigned amount and the power consumption increase as a result. According to the configuration described above, the increase of the power consumption can be prevented because the number of continuing bits of the serial signal can be effectively reduced without excessively assigning the input terminal for preventing bit continuations 151*a*, 152*a*.

Figure 10:
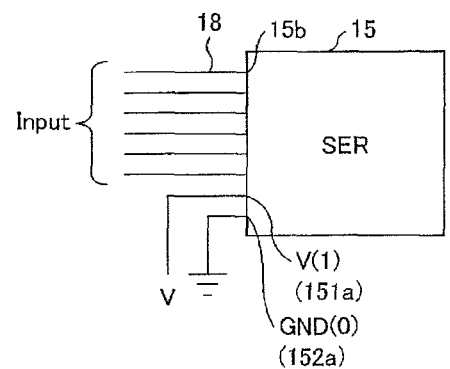
FIG. 10 is a block diagram showing a specific example of the first input terminal for preventing bit continuation and the second input terminal for preventing bit continuation.

FIG. 10 is a block diagram showing a specific example of the first input terminal for preventing bit continuation and the second input terminal for preventing bit continuation.

As shown in the figure, the input terminal for preventing bit continuation 151*a* is V(1) terminal to which a power supply voltage (V) is input. The input terminal for preventing bit continuation 152*a* is GND(0) terminal to which a ground voltage is input. A signal of a range the value of "1" can be recognized is input to the V(1) terminal.

According to such configuration, when the number of inputs of the parallel signal input to the serializer 15 is m, the serial signal transmitted through the optical transmission path 4 becomes a signal in which the value of "0" or the value "1" is repeated for every m bits, and the continuing bits can be avoided.

Furthermore, the optical transmission system 100 has a simple configuration in which the GND(0) terminal or the V(1) terminal is assigned to the input terminal portion of the serializer 15, and hence the increase in cost, size, and power consumption can be eliminated compared to the configuration in which the coding unit is arranged. Furthermore, a serializer without the coding unit (with no coding function) is currently commercially available, and the signal transmission of the optical transmission module 1 can be realized with a simple configuration with respect to such a serializer.

The serializer 15 merely needs to have a configuration in which the GND(0) terminal and the V(1) terminal are assigned to the input terminal portion, and may be arranged inside the CPU 29 or may be arranged outside the CPU 29.

Furthermore, when assigning the value of "0" and the value of "1" to the serial signal transmitted through the optical transmission path 4, the configuration of the signal line to connect to the V(1) terminal or the GND(0) terminal may be a floating configuration. In this case, the signal from the signal line of floating configuration is recognized as "0" or "1" by the IC circuit mounted on the serializer 15.

(First Variant)

Another variant of the configuration shown in FIG. 1 and FIG. 8 will now be described with respect to the configuration of the optical transmission system 100 according to the present embodiment.

The binary signal (hereinafter referred to as fixed signal) that takes the value of "0" or the value of "1" for the majority of the period sometimes exist in the parallel signal output from the CPU 29 depending on the configuration/specification of the optical transmission system. In other words, a signal line for outputting the fixed signal to the serializer 15 exists in the input signal line 18.

Figure 11:
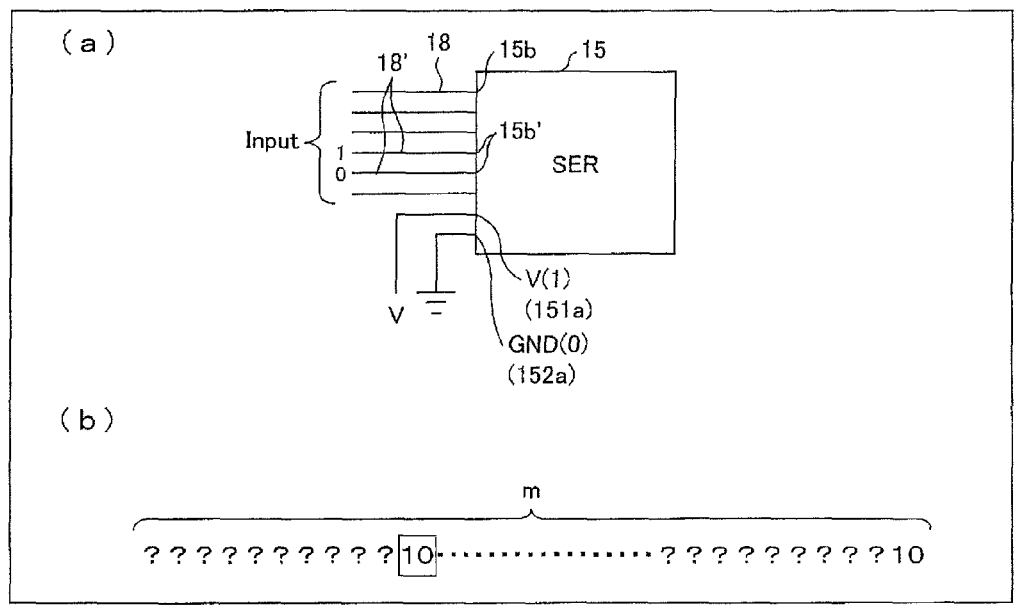
FIG. 11(a) is a block diagram schematically showing the arrangement of an input signal line between a CPU and a serializer in an optical transmission system serving as a first variant.
FIG. 11(b) is a conceptual view showing a serial signal pattern in the optical transmission system serving as the first variant.

As a variant of the optical transmission system 100, the input terminal for preventing bit continuation 151*a* or 152*a* can be assigned to the serializer 15 in considering such fixed signal. FIG. 11(*a*) is a block diagram schematically showing the arrangement of the signal line between the CPU 29 and the serializer 15 in the optical transmission system 100 serving as a first variant.

As shown in FIG. 11(*a*), a signal line 18' for outputting the fixed signal is arranged in the data input signal line 18. The data input terminal 15*b'* to be connected with the signal line 18' is arranged at the serializer 15. The V(1) terminal and the GND(0) terminal are assigned separate from the data input terminal 15*b'*.

FIG. 11(*b*) is a conceptual view showing a serial signal pattern in the optical transmission system 100 serving as the first example. As shown in the figure, if the number of inputs of the parallel signal input to the serializer 15 is m, the signal from the data input terminal 15*b'* (fixed signal surrounded with a square in FIG. 10B) is repeated for every m bits. The signals from the V(1) terminal and the GND(0) terminal are repeated for every m bits apart from the signal from the data input terminal 15*b'*. In the first variant, the bit continuation can be reliably prevented because two positions where the "0" signal and the "1" signal are to be inserted exist in the m bits of the serial signal pattern.

In the first variant, because the continuing bits are prevented using the fixed signal of the parallel signals output from the CPU 29 (using the terminal for receiving the fixed signal as the terminal for preventing bit continuation), the assigning number of input terminal for preventing bit continuations at the input terminal portion of the serializer 15 can be ensured at small number. In particular, the configuration of the first variant is particularly effective when the assigning number of input terminal for preventing bit continuation is limited in terms of the relationship between the number of signals output from the CPU 29 and the number of input terminals of the serializer 15.

If a great number of input terminal for preventing bit continuations is assigned, the transmission rate of the serial signal increases by the assigned amount, and the power consumption increases as a result. In the first variant, the increase of the power consumption can be prevented because the assigning number of input terminal for preventing bit continuations can be ensured at a small number.

A signal that takes the value of "0" or the value of "1" for the majority of the period (frequency that changes with respect to the data signal output from the CPU 29 is sufficiently long) can be used for the fixed signal. The fixed signal may be a signal that always takes the value of "0" or the value of "1" during transmission of the data signal, or a signal in which the value of the signal differs for every one data bit. For instance, the control signal (vertical synchronization signal etc.) for controlling the data signal output from the CPU 29 can be used for the fixed signal. The chip select signal, the address/data selector input signal, and the like can be used for the fixed signal depending on the configuration of the optical transmission system.

(Regarding Input Terminal for Preventing Bit Continuation)

One example of the assignment of the input terminal for preventing bit continuation will be described below.

Other than the input terminal for receiving the parallel signal from the CPU 29, a power supply terminal for receiving the power supply voltage of the serializer 15 and a ground terminal for receiving a ground voltage are assigned to the input port (assigning portion of input terminal) of the serializer 15.

Figure 12:
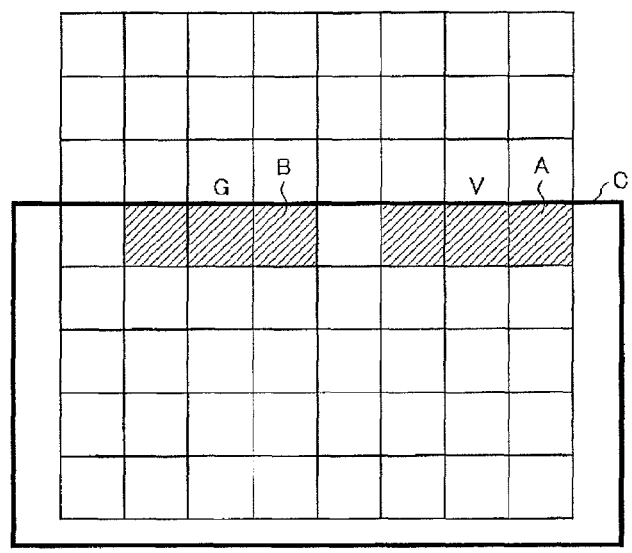
FIG. 12 is a schematic view showing one example of an input port of a serializer.

FIG. 12 is a schematic view showing one example of the input port of the serializer 15. The example shown in the figure is the input port of BGA type (Flip chip). It should be recognized that the configuration of the input port of the serializer 15 is not limited to the configuration shown in FIG. 12. For instance, the SMD type can be applied as the input port of the serializer 15 other than the BGA type.

"V" shown in the figure means the assigning position of the power supply terminal. "G" means the assigning position of the ground terminal. The region C surrounded with a square means the region assigned for the input terminal of the signal to be serialized in terms of the configuration of the IC circuit.

The V(1) terminal is preferably assigned to the port A proximate to the power supply terminal "V" in the serializer 15. The GND(0) terminal is preferably assigned to the port B proximate to the ground terminal "G". With such assignment, the drawing of wiring to the power supply terminal "V" of the V(1) terminal at a mounting substrate surface of the serializer 15 is facilitated. Furthermore, the drawing of the wiring to the ground terminal "G" of the GND(0) terminal is facilitated. This configuration facilitates the input of the "0" signal and the "1" signal to the serializer 15.

(Second Variant)

Figure 13:
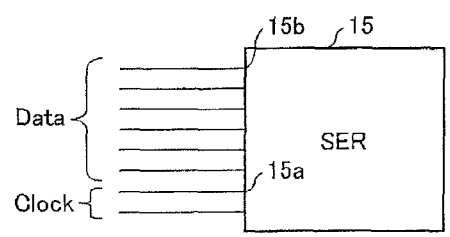
FIG. 13 is a block diagram showing the configuration of a serializer arranged in an optical transmission system of a second variant.

Another variant of the configuration shown in FIG. 1 and FIG. 8 will now be described with respect to the configuration of the optical transmission system 100 according to the present embodiment. FIG. 13 is a block diagram showing the configuration of the serializer 15 arranged in an optical transmission system of a second variant.

As shown in the figure, the data signal and the clock signal are input to the input terminal portion of the serializer 15. The input terminal 15b is assigned to the data signal input of the data signal and the clock signal. The input terminal for preventing bit continuation 15a is assigned to the clock signal input. The clock signal is a signal in which the value of "0" and the value of "1" are repeated at a constant cycle, and can be used as a signal to be input to the input terminal for preventing bit continuation 15a. In other words, the serial signal output from the serializer 15 becomes a signal in which the "0" signal and the "1" signal are inserted at a constant interval, and bit continuation can be prevented.

Figure 14:
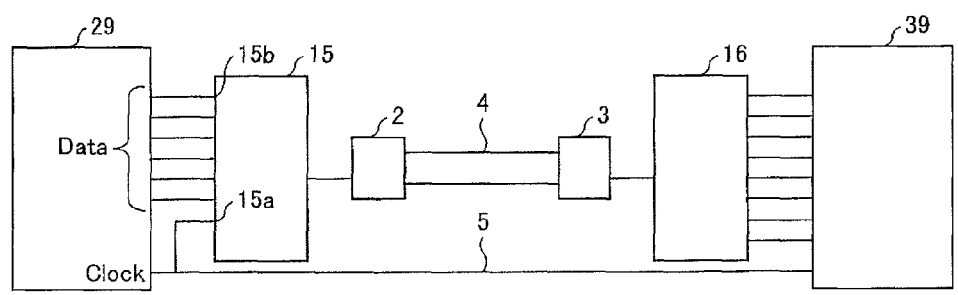
FIG. 14 is a bock diagram showing the configuration of the optical transmission system of the second variant.

The optical transmission system 100 including the serializer 15 of the second variant will now be described. FIG. 14 is a block diagram showing the configuration of the optical transmission system 100 of the second variant.

As shown in the figure, the optical transmission system 100 includes an electric transmission path 5 for connecting the CPU 29 and the LCD driver 39. The electric transmission path 5 is a medium, arranged in parallel to the optical transmission path 4, for transmitting the clock signal output from the CPU 29. As described above, the optical transmission path 4 is a medium for transmitting the data signal output from the CPU 29.

In the optical transmission system 100 of the second variant, a clock signal wiring 18a branched to the electric transmission path 5 is arranged. The clock signal is input to the input terminal for preventing bit continuation 18b of the serializer 15 through such clock signal wiring 18a. The serial signal output from the serializer 15 thus becomes a signal inserted with the clock signal. The bit continuation can be prevented because such a serial signal is transmitted through the optical transmission path 4.

The configuration shown in FIG. 14 is a configuration in which the input terminal for preventing bit continuation 18b is arranged at the input terminal of the serializer 15 as a dummy bit, and the clock signal is input to the dummy bit. However, the optical transmission system 100 of the second variant is not limited to this configuration.

FIG. 15(a) is a block diagram showing another configuration of the optical transmission system 100 of the second variant, FIG. 15(b) is a signal waveform chart when the clock signal transmitted through the optical transmission system 100 shown in FIG. 15(a) is lower in speed than the data signal, and FIG. 15(c) is a signal waveform chart when the clock signal transmitted through the optical transmission system 100 shown in FIG. 15(a) is high speed (same speed as data signal). In FIGS. 15(b) and 15(c), the signal transmitting through the optical transmission system 100 is called a differential signal.

As shown in FIG. 15(a), the serializer 15 converts the image data signal and the clock signal output from the CPU 29 to a serial signal, and outputs the converted image data signal to the light transmission processing section 2. The image data signal and the clock signal converted to a serial signal is converted to an optical signal in the light transmission processing section 2. The converted optical signal is transmitted to the light reception processing section 3 through the optical transmission path 4.

The light reception processing section 3 receives the light of the optical signal of the image data signal and the clock signal transmitted through the optical transmission path 4, converts the same to an electric signal through photoelectric conversion, amplifies the electric signal to output the amplified electric signal to the deserializer 16.

The deserializer 16 converts the image data signal and the clock signal serving as serial signals transmitted from the main control substrate 20 side to a parallel signal, and inputs the resulting signal to the LCD driver 39.

The signal indicated with (I) of FIGS. 15(b) and 15(c) indicates the parallel signal output from the CPU 29. The signal indicated with (II) of FIGS. 15(b) and 15(c) indicates the serial signal transmitted between the serializer 15 and the light transmission processing section 2, and between the light reception processing section 3 and the serializer 16. The signal indicated with (III) of FIGS. 15(b) and 15(c) indicates the parallel signal output from the deserializer 16.

Figure 15:
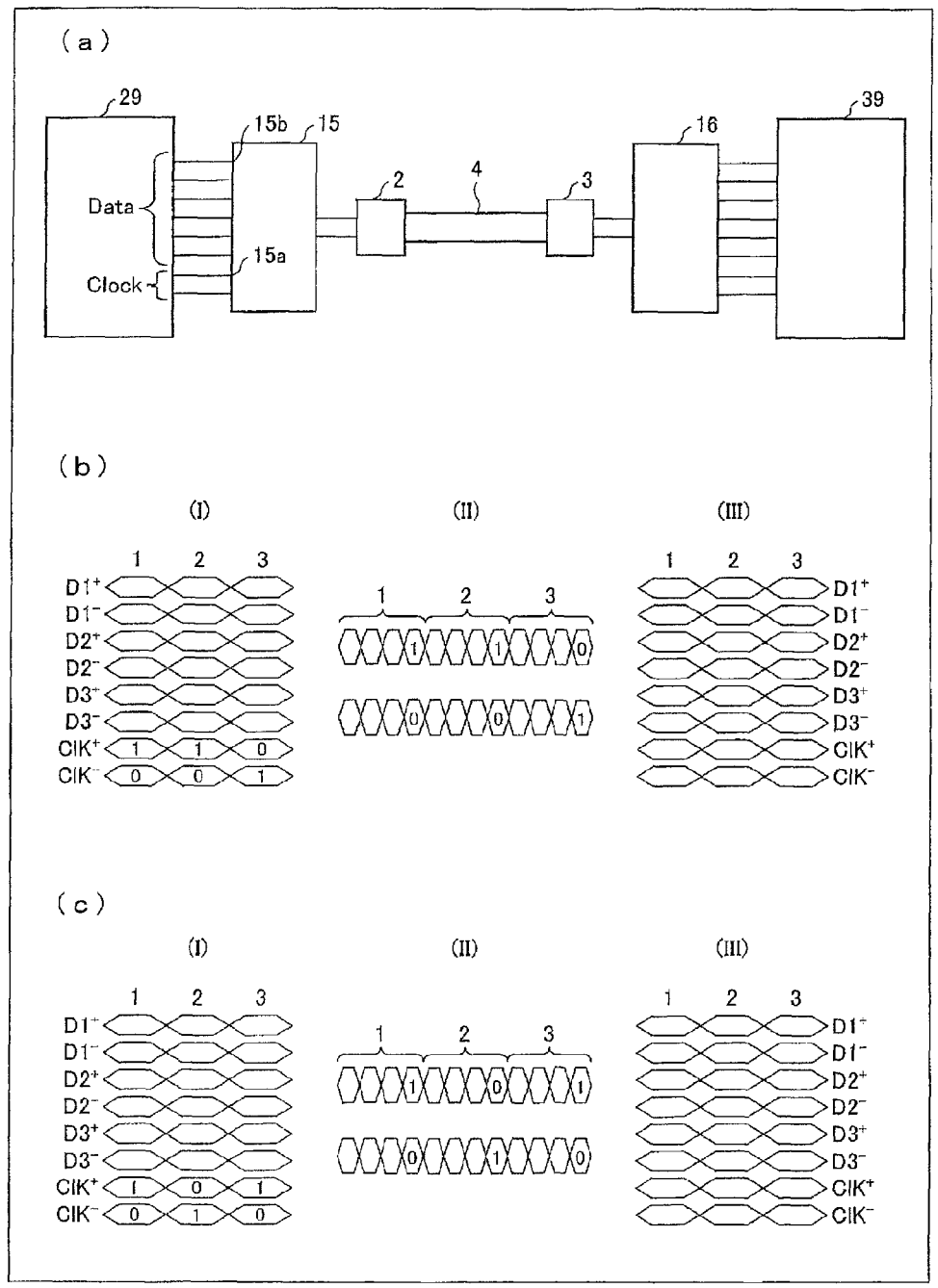
FIG. 15(a) is a block diagram showing another configuration of the optical transmission system of the second variant.
FIG. 15(b) is a signal waveform chart when a clock signal transmitted through the optical transmission system shown in FIG. 15(a) is lower in speed than a data signal.
FIG. 15(c) is a signal waveform chart when a clock signal transmitted through the optical transmission system shown in FIG. 15(a) is high speed (same speed as data signal).

When the clock signal is lower in speed than the data signal, the serial signal transmitted between the serializer 15 and the light transmission processing section 2 becomes the signal in which the clock signal is inserted to the image data signal, that is, the value of "0" and the value of "1" are respectively inserted for every one data bit, as shown in (II) of FIG. 15(b). The value of "0" and the value of "1" to be inserted alternately change for every predetermined data bit (every two data bits in FIG. 15).

When the clock signal is high speed (same speed as data signal), the signal transmitted between the serializer 15 and the light transmission processing section 2 becomes a signal in which the value of "0" and the value of "1" are alternately changed and inserted for every one data bit.

The bit continuation of the signal is prevented when such serial signal is transmitted through the optical transmission path 4.

The configuration shown in FIGS. 15(*a*) to 15(*c*) is a configuration in which the optical signals of the image signal and the clock signal transmitted through the optical transmission path 4 are converted to parallel signals in the deserializer 16 and input to the LCD driver 39. In other words, a configuration that does not require the electric transmission path 5 for transmitting the clock signal is provided. Thus, the configuration shown in FIGS. 15(*a*) to 15(*c*) has an effect that the electric wiring for clock transmission can be reduced compared to the optical transmission system 100 shown in FIG. 14.

Furthermore, when the clock signal is high speed (same speed as data signal), the value of "0" or the value of "1" alternately changes for every one data bit in the serial signal. Thus, the bit continuation length does not become long and the bit continuation can be reliably prevented compared to the case where the clock signal is lower speed than the data signal. Moreover, the configuration of FIG. 15(*c*) can be available even if the signal transmission rate characteristics (low pass cut-off characteristics) of the optical transmission module 1 are strictly set.

In the configuration of FIGS. 15(*a*) to 15(*c*), the signal transmitted through the optical transmission system 100 is a differential signal. However, the signal transmitted through the optical transmission system 100 is not limited to such a signal, and similar effects can be obtained with a single end signal.

When the clock signal is lower in speed than the data signal, an input terminal, to which an inverted signal of the clock signal is input, may be separately assigned to the input terminal portion of the serializer 15. The bit continuation length of the serial signal transmitted through the optical transmission path 4 then can be reliably reduced. If the clock signal is lower in speed than the data signal, the clock signal merely needs to be about 30 MHz in the optical transmission system 100.

The serializer 15 and the deserializer 16 may be configured to include a phase synchronization circuit (PLL; phase locked loop).

(Application example)

The optical transmission system 100 of the present embodiment can be applied to the following application examples. In the above-described embodiment, description has been made using an example of applying to the portable telephone 40 as the application example, but it is not limited thereto, and application can be made to the hinge etc. of a foldable electronic apparatus such as a foldable PHS (Personal Handy phone System), a foldable PDA (Personal Digital Assistant), and a foldable notebook computer.

A high speed and large capacity communication can be realized in a limited space by applying the optical transmission system 100 to such foldable electronic apparatuses. Therefore, it is particularly suitable for an apparatus that needs high speed and large capacity data communication and requires to be reduced in size such as a foldable liquid crystal display device.

In a further application example, the optical transmission system 100 can be applied to an apparatus including a drive unit such as a printer head of a printing device (electronic apparatus) and a reading unit of a hard disc recording and reproducing device.

Figure 16:
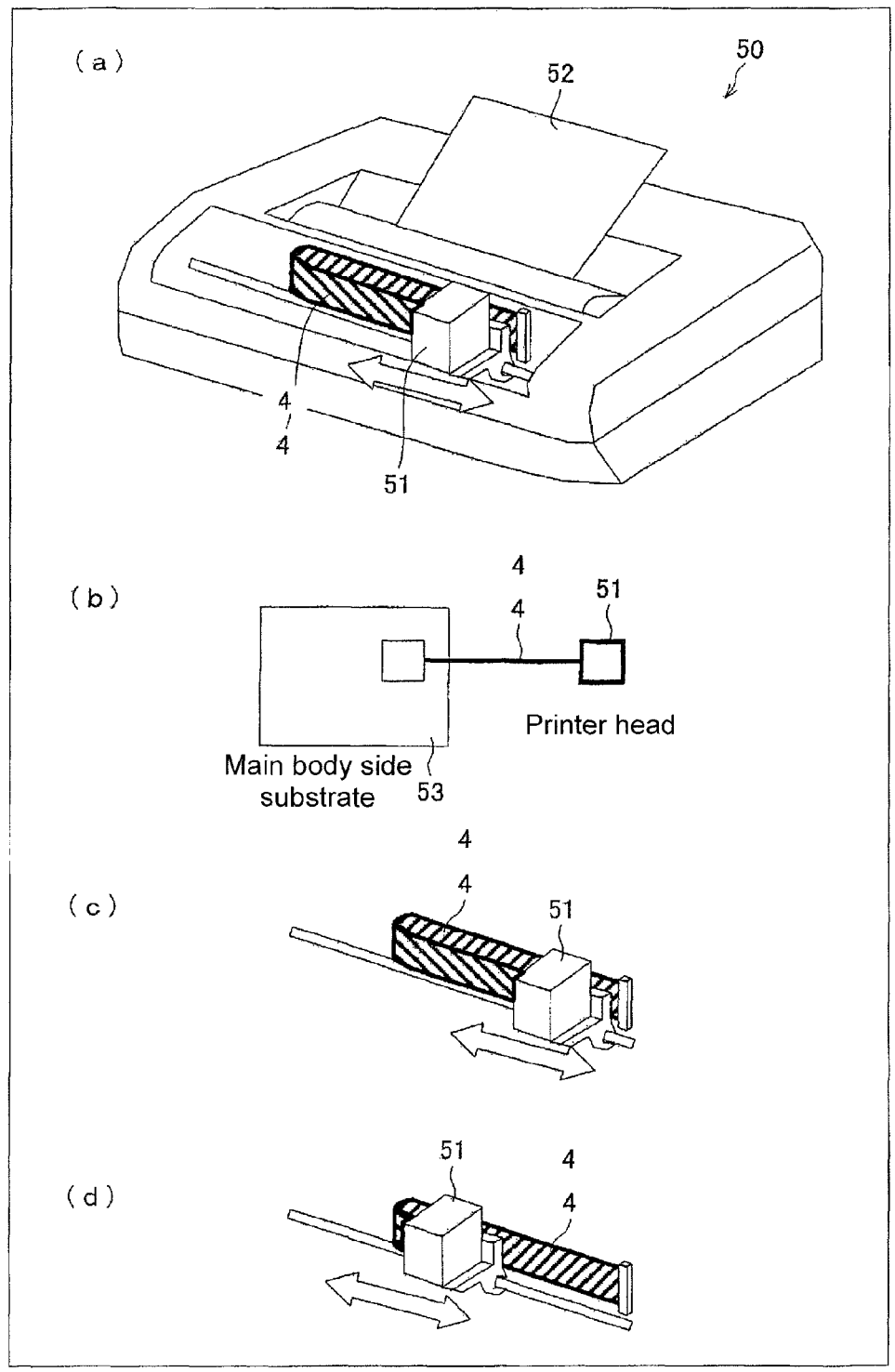
FIG. 16(a) is a perspective view showing an outer appearance of a printing device including the optical transmission system of the present embodiment.
FIG. 16(b) is a block diagram showing a main part of the printing device shown in FIG. 16(a).
FIGS. 16(c) and 16(d) are perspective views showing a curved state of the optical transmission path when the printer head is moved (driven) in the printing device.

FIGS. 16(*a*) to 16(*c*) show an example in which the optical transmission system 100 is applied to a printing device 50. FIG. 16(*a*) is a perspective view showing an outer appearance of the printing device 50. As shown in the figure, the printing device 50 includes a printer head 51 for performing printing with respect to a paper 54 while moving in the width direction of the paper 54, where one end of the optical transmission module 1 is connected to the printer head 51.

FIG. 16(*b*) is a block diagram showing a portion applied with the optical transmission system 100 in the printing device 50. As shown in the figure, one end of the optical transmission system 100 is connected to the printer head 51, and the other end is connected to a main body side substrate in the printing device 50. The main body side substrate includes control means for controlling the operation of each unit of the printing device 50, and the like.

FIG. 16(*c*) and FIG. 16(*d*) are perspective views showing a curved state of the optical transmission path 4 when the printer head 51 is moved (driven) in the printing device 50. As shown in the figure, when applying the optical transmission path 4 to the drive unit such as the printer head 51, the curved state of the optical transmission path 4 changes by the drive of the printer head 51 and each position of the optical transmission path 4 is repeatedly curved.

Therefore, the optical transmission system 100 according to the present embodiment is suitable for such drive unit. The high speed and large capacity communication using the drive unit can be realized by applying the optical transmission system 100 to the drive unit.

Figure 17:
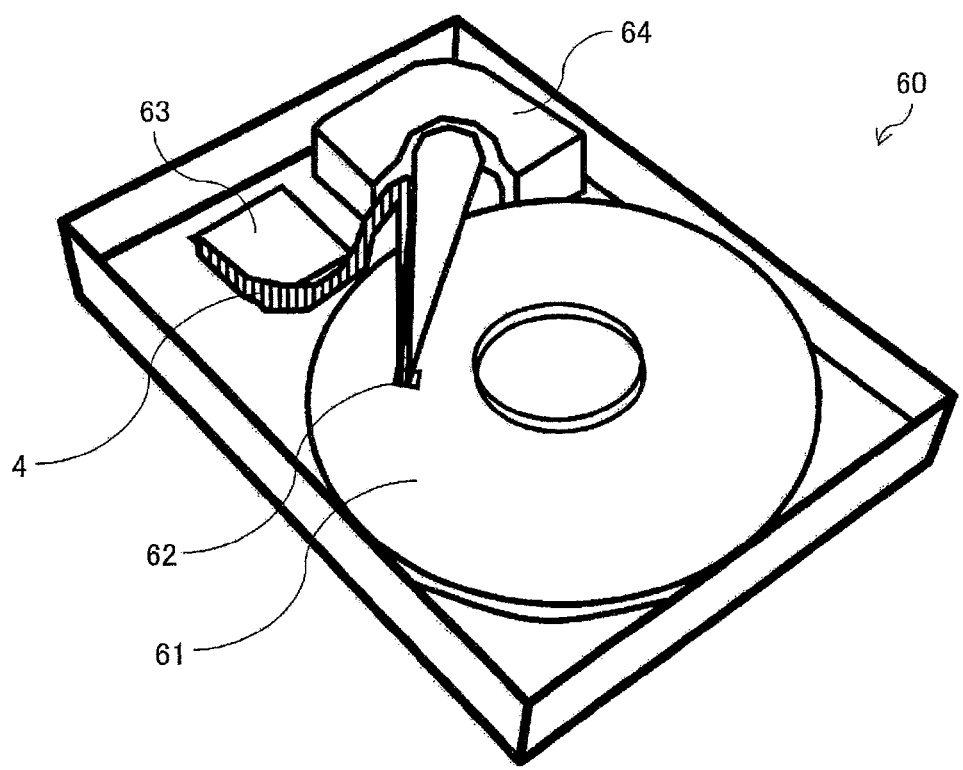
FIG. 17 is a perspective view showing an outer appearance of a hard disc recording and reproducing device including the optical transmission system of the present embodiment.
Figure 18:
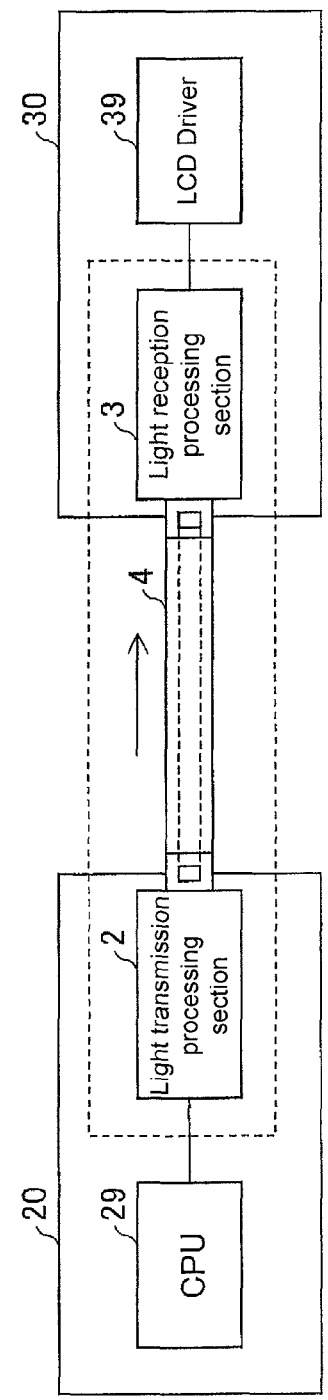
FIG. 18 is a block diagram of a portion applied with the optical transmission module in a foldable portable telephone incorporating the optical transmission module.

FIG. 17 shows an example in which the optical transmission system 100 is applied to a hard disc recording and reproducing device 60.

As shown in the figure, the hard disc recording and reproducing device 60 includes a disc (hard disc) 61, a head (head for reading and writing) 62, a substrate introducing unit 63, a drive unit (drive motor) 64, and an optical transmission module 1.

The drive unit 64 drives the head 62 along the radial direction of the disc 61. The head 62 reads information recorded on the disc 61, and writes information to the disc 61. The head 62 is connected to the substrate introducing unit 63 through the optical transmission module 1, and propagates the information read from the disc 61 to the substrate introducing unit 63 as an optical signal, and receives the optical signal of the information to write to the disc 61 propagated from the substrate introducing unit 63.

Therefore, the high speed and large capacity communication can be realized by applying the optical transmission module 1 to the drive unit such as the head 62 in the hard disc recording and reproducing device 60.

The optical transmission system 100 of the present embodiment can also be used for the signal transmission between the information terminal such as a video camera and a notebook computer, and the substrate, in addition to the above application example.

The parallel-serial converter for optical transmission of one or more embodiments of the present invention has a configuration in which the input terminal for preventing bit continuation for inserting the "1" signals or the "0" signals to the serial binary signal so that a predetermined number of bits of the same value is not inserted continuously is assigned to the plurality of input terminals.

The optical transmission system of one or more embodiments of the present invention is configured to include a signal generation unit for outputting a plurality of binary signals in parallel to each other, the parallel-serial converter for optical transmission for inputting the plurality of binary signals and converting to a serial binary signal, and an optical transmission module, including an optical converter for converting the serial binary signal output from the parallel-serial converter for optical transmission to an optical signal, for transmitting the optical signal converted by the optical converter through the optical transmission path.

An electronic apparatus of one or more embodiments of the present invention is configured to include the optical transmission system.

Therefore, the continuing bits can be avoided without increasing the cost, the size, and the power consumption compared to the configuration in which the coding unit is arranged as in Patent Document 1. Furthermore, the optical transmission system by the optical transmission module can be applied to the electronic apparatus with a simple configuration. The drawing of wiring of the mounting substrate in the electronic apparatus can be simplified and the space inside the electronic apparatus can be saved by applying the optical transmission system of one or more embodiments of the present invention to the electronic apparatus.

In the parallel-serial converter for optical transmission according to one or more embodiments of the present invention, preferably, a predetermined number of bits n satisfies $n<R/fmin$, where fmin is a minimum value of a signal transmission rate of the optical transmission module and R is a signal transmission rate of the serial binary signal.

In the optical transmission system, the number of the input terminal for preventing bit continuation that can be assigned is sometimes limited in regards to the relationship of the number of parallel signals input to the parallel-serial converter for optical transmission and the number of input terminals of the parallel-serial converter for optical transmission. In such a case, the assigning number of the input terminal for preventing bit continuation can be appropriately ensured by limiting the number of bit continuations n.

When the assigning number of input terminal for preventing bit continuations becomes relatively large, the signal from the input terminal for preventing bit continuation is added to the serial signal necessary for the transmission of the image data. The signal transmission rate of the optical transmission module increases by the added signal, and as a result, the power consumption increases. The increase of the power consumption by the signal amount from the input terminal for preventing bit continuation can be prevented by limiting the number of bit continuations n.

In the parallel-serial converter for optical transmission according to one or more embodiments of the present invention, preferably, a first input terminal for preventing bit continuation for inserting "1" signals so that the value of "0" does not continue for a predetermined number of bits or a second input terminal for preventing bit continuation for inserting "0" signals so that the value of "1" does not continue for a predetermined number of bits is assigned as the input terminal for preventing bit continuation.

According to the configuration, the continuing bits can be avoided with a simple configuration without increasing the cost, the size, and the power consumption because the first input terminal for preventing bit continuation for inserting the "1" signal so that the value of "0" does not continue for a predetermined number of bits, or the second input terminal for preventing bit continuation for inserting the "0" signal so that the value of "1" does not continue for a predetermined number of bits are assigned as the input terminal for preventing bit continuation.

In the parallel-serial converter for optical transmission according to one or more embodiments of the present invention, preferably, the first input terminal for preventing bit continuation and the second input terminal for preventing bit continuation are both assigned.

According to the above configuration, because the first input terminal for preventing bit continuation and the second input terminal for preventing bit continuation are both assigned, the serial binary signal transmitted through the optical transmission module becomes the signal in which the value of "0" and the value of "1" are alternately and periodically inserted. The number of continuing bits of the value of "0" or the value of "1" of the serial binary signal can be reduced with the minimum assigning number of input terminal for preventing bit continuations.

In the parallel-serial converter for optical transmission according to one or more embodiments of the present invention, preferably, the first input terminal for preventing bit continuation and the second input terminal for preventing bit continuation are assigned so as to be at equal interval from each other and so as to be alternate at the plurality of input terminals.

According to the above configuration, the first input terminal for preventing bit continuation and the second input terminal for preventing bit continuation are assigned to the plurality of input terminals so as to be at equal interval to each other and to be alternate, and hence the number of continuing bits of the value of "0" or the value of "1" of the serial binary signal can be effectively reduced when the assigning number of input terminal for preventing bit continuations is limited particularly in regards to the relationship of the number of input terminals of the parallel-serial converter for optical transmission and the number of binary signals to be input.

In the parallel-serial converter for optical transmission according to one or more embodiments of the present invention, preferably, the first input terminal for preventing bit continuation and the second input terminal for preventing bit continuation are adjacent.

According to the above configuration, the first input terminal for preventing bit continuation and the second input terminal for preventing bit continuation are adjacent, and thus the serial binary signal transmitted through the optical transmission module becomes a signal in which the continuation of the value of "0" and the value of "1" is periodically inserted. Thus, the number of continuing bits of the value of "0" or the value of "1" of the serial binary signal can be reliably reduced.

In the parallel-serial converter for optical transmission according to one or more embodiments of the present invention, preferably, a power supply voltage is input to the first input terminal for preventing bit continuation; and a ground voltage is input to the second input terminal for preventing bit continuation.

According to the above configuration, the number of continuing bits of the value of "0" or the value of "1" of the serial binary signal transmitted through the optical transmission module can be reduced with a simple configuration of inputting the power supply voltage to the first input terminal for preventing bit continuation and inputting the ground voltage to the second input terminal for preventing bit continuation.

Preferably, the parallel-serial converter for optical transmission according to one or more embodiments of the present invention further includes a power supply terminal and a ground terminal; wherein the first input terminal for preventing bit continuation is arranged proximate to and connected to the power supply terminal; and the second input terminal for preventing bit continuation is arranged proximate to and connected to the ground terminal.

According to the above configuration, the power supply terminal and the ground terminal are further arranged, and the first input terminal for preventing bit continuation is arranged proximate to the power supply terminal and connected thereto, and hence the drawing of the wiring to the power supply terminal of the first input terminal for preventing bit continuation at the mounting substrate surface of the parallel-serial converter for optical transmission is facilitated, and the input of the power supply voltage is facilitated. According to the above configuration, the second input terminal for preventing bit continuation is arranged proximate to the ground terminal and connected thereto, and hence the drawing of the wiring to the ground terminal of the second input terminal for preventing bit continuation is facilitated and the input of the ground voltage is facilitated.

In the parallel-serial converter for optical transmission according to one or more embodiments of the present invention, preferably, a terminal into which the binary signals, where the majority of the period is "0" value, are input is assigned as the second input terminal for preventing bit continuation; and a terminal into which the binary signals, where the majority of the period is "2" value, are input is assigned as the first input terminal for preventing bit continuation.

Depending on the configuration and the specification of the optical transmission system, the binary signal in which the majority of the period is the value of "0" or the binary signal in which the majority of the period is the value of "1" sometimes exists in the binary signal to be transmitted through the optical transmission module. According to the configuration, the terminal to which the binary signal in which the majority of the period is the value of "0" is input is assigned as the second input terminal for preventing bit continuation, and the terminal to which the binary signal in which the majority of the period is the value of "1" is input is assigned as the first input terminal for preventing bit continuation, and hence the bit continuation can be reliably prevented.

In the parallel-serial converter for optical transmission according to one or more embodiments of the present invention, preferably, a data signal input terminal into which a data signal is input is assigned to the plurality of input terminals; and a clock signal is input to the input terminal for preventing bit continuation.

According to the above configuration, the data signal input terminal, to which the data signal is input, is assigned to the plurality of input terminals, and the clock signal is input to the input terminal for preventing bit continuation, and hence the serial binary signal output from the parallel-serial converter for optical transmission becomes the signal in which the value of "0" and the value of "1" are inserted at a constant interval, and the bit continuation can be prevented.

In the parallel-serial converter for optical transmission according to one or more embodiments of the present invention, preferably, the clock signal is lower speed than the data signal.

In the parallel-serial converter for optical transmission according to one or more embodiments of the present invention, preferably, the clock signal is higher in speed than or same in speed as the data signal.

According to the above configuration, the serial binary signal output from the parallel-serial converter for optical transmission becomes the signal in which the clock signal is inserted to the data signal. That is, it becomes the signal in which the value of "0" and the value of "1" are alternately changed and inserted for every data signal of a predetermined number of bits. The bit continuation of the signal can be prevented when such serial binary signal is transmitted through the optical transmission module.

In the parallel-serial converter for optical transmission according to one or more embodiments of the present invention, preferably, an inverted signal of the clock signal is further input to the plurality of input terminals. The bit continuation of the signal is thus reliably prevented.

Preferably, the optical transmission system according to one or more embodiments of the present invention further includes: a control unit for performing a control on a data signal output from the signal generation unit based on a clock signal output from the signal generation unit; wherein the signal generation unit outputs the data signal and the clock signal as parallel binary signals; an electrical signal line for transmitting the clock signal from the signal generation unit to the control unit is further arranged; and the parallel-serial converter for optical transmission has the clock signal from the electric signal line input to the input terminal for preventing bit continuation.

According to the above configuration, the serial binary signal transmitted through the optical transmission path becomes a signal in which the clock signal is inserted to the data signal, and hence the continuing bits can be avoided with a simple configuration.

Preferably, the optical transmission system according to one or more embodiments of the present invention further includes: a control unit for performing a control on a data signal output from the signal generation unit based on a clock signal output from the signal generation unit; wherein the signal generation unit outputs the data signal and the clock signal as parallel binary signals; and the optical transmission module converts at least the clock signal to an optical signal by means of the optical converter, and transmits the optical signal through an optical transmission path to output the transmitted optical signal to the control unit.

According to the above configuration, a control unit for performing the control based on the clock signal output from the signal generator with respect to the data signal output from the signal generator is arranged, and the signal generator outputs the data signal and the clock signal as a parallel binary signal, and the optical transmission module converts at least the clock signal to the optical signal by the optical converter, transmits the optical signal through the optical transmission path to output the transmitted optical signal to the control unit, and hence the serial binary signal transmitted through the optical transmission path becomes the signal in which the clock signal is inserted to the data signal, and the resulting signal is output to the control unit after subjecting to a parallel conversion. According to the configuration, the optical transmission system capable of reducing the electrical signal line serving as a medium for transmitting the clock signal can be realized.

Specific embodiments or examples described in the best mode for carrying out the invention are merely provided to clarify the technical content of the present invention, and should not be limited only to such examples and interpreted in a narrow sense, and the embodiments obtained by appropriately combining the technical means disclosed in different embodiments are also encompassed in the technical scope of the invention within the spirit of the invention and the Claims described below The one or more embodiments of the present invention are also applicable to an optical communication path between various types of devices, and are also applicable to a flexible optical wiring serving as an in-device wiring mounted in a small and thin consumer device.

The invention claimed is:

1. A parallel-serial converter for optical transmission, comprising:
    a plurality of input terminals into which a plurality of binary signals are input in parallel, for converting the plurality of input binary signals to serial binary signals and transmitting the signals to an optical transmission module; and
    an input terminal for preventing bit continuation for inserting "1" signals or "0" signals into the serial binary signals so that the same value does not continue for a predetermined number of bits is assigned to the plurality of input terminals,
    wherein a first input terminal for preventing bit continuation for inserting "1" signals so that the value of "0" does not continue for a predetermined number of bits or a second input terminal for preventing bit continuation for inserting "0" signals so that the value of "1" does not continue for a predetermined number of bits is assigned as the input terminal for preventing bit continuation,
    wherein the first input terminal for preventing bit continuation and the second input terminal for preventing bit continuation are both assigned, and
    wherein the first input terminal for preventing bit continuation and the second input terminal for preventing bit continuation are assigned so as to be at equal interval from each other and so as to be alternate at the plurality of input terminals.

2. The parallel-serial converter for optical transmission according to claim 1, wherein a predetermined number of bits n satisfies $n < R/f_{min}$, where $f_{min}$ is a minimum value of a signal transmission rate of the optical transmission module, and R is a signal transmission rate of the serial binary signal.

3. The parallel-serial converter for optical transmission according to claim 1, wherein the first input terminal for preventing bit continuation and the second input terminal for preventing bit continuation are adjacent.

4. The parallel-serial converter for optical transmission according to claim 1,
    wherein a power supply voltage is input to the first input terminal for preventing bit continuation, and
    wherein a ground voltage is input to the second input terminal for preventing bit continuation.

5. The parallel-serial converter for optical transmission according to claim 4, further comprising:
    a power supply terminal; and
    a ground terminal,
    wherein the first input terminal for preventing bit continuation is arranged proximate to and connected to the power supply terminal, and
    wherein the second input terminal for preventing bit continuation is arranged proximate to and connected to the ground terminal.

6. The parallel-serial converter for optical transmission according to claim 1, further comprising:
    a data signal input terminal into which a data signal is input, wherein the data signal input terminal is assigned to the plurality of input terminals; and
    a clock signal, wherein the clock signal is input to the input terminal for preventing bit continuation.

7. The parallel-serial converter for optical transmission according to claim 6, wherein the clock signal is lower in speed than the data signal.

8. The parallel-serial converter for optical transmission according to claim 6, wherein the clock signal is higher in speed than, or same in speed as, the data signal.

9. The parallel-serial converter for optical transmission according to claim 6, wherein an inverted signal of the clock signal is further input to the plurality of input terminals.

10. An optical transmission system comprising:
    a signal generation unit for outputting a plurality of binary signals in parallel;
    a parallel-serial converter for optical transmission according to claim 1 for receiving the plurality of binary signals and converting the received binary signals to serial binary signals; and
    an optical transmission module including an optical converter for converting the serial binary signals output from the parallel-serial converter for optical transmission to optical signals, and transmitting the optical signals converted by the optical converter through an optical transmission path.

11. The optical transmission system according to claim 10, further comprising:
    a control unit for performing a control on a data signal output from the signal generation unit based on a clock signal output from the signal generation unit,
    wherein the signal generation unit outputs the data signal and the clock signal as parallel binary signals; and
    an electrical signal line for transmitting the clock signal from the signal generation unit to the control unit is further arranged,
    wherein the parallel-serial converter for optical transmission has the clock signal from the electric signal line input to the input terminal for preventing bit continuation.

12. The optical transmission system according to claim 10, further comprising:
    a control unit for performing a control on a data signal output from the signal generation unit based on a clock signal output from the signal generation unit,
    wherein the signal generation unit outputs the data signal and the clock signal as parallel binary signals, and
    wherein the optical transmission module converts at least the clock signal to an optical signal by means of the optical converter, and transmits the optical signal through an optical transmission path to output the transmitted optical signal to the control unit.

13. An electronic apparatus comprising the optical transmission system according to claim 10.

14. A parallel-serial converter for optical transmission, comprising:
    a power supply terminal;
    a ground terminal;
    a plurality of input terminals into which a plurality of binary signals are input in parallel, for converting the plurality of input binary signals to serial binary signals and transmitting the signals to an optical transmission module; and
    an input terminal for preventing bit continuation for inserting "1" signals or "0" signals into the serial binary signals so that the same value does not continue for a predetermined number of bits is assigned to the plurality of input terminals,
    wherein a first input terminal for preventing bit continuation for inserting "1" signals so that the value of "0" does not continue for a predetermined number of bits or a second input terminal for preventing bit continuation for inserting "0" signals so that the value of "1" does not continue for a predetermined number of bits is assigned as the input terminal for preventing bit continuation,
    wherein a power supply voltage is input to the first input terminal for preventing bit continuation, wherein a ground voltage is input to the second input terminal for preventing bit continuation, wherein the first input terminal for preventing bit continuation is arranged proximate to and connected to the power supply terminal, and wherein the second input terminal for preventing bit continuation is arranged proximate to and connected to the ground terminal.

15. A parallel-serial converter for optical transmission, comprising:

a plurality of input terminals into which a plurality of binary signals are input in parallel, for converting the plurality of input binary signals to serial binary signals and transmitting the signals to an optical transmission module; and an input terminal for preventing bit continuation for inserting "1" signals or "0" signals into the serial binary signals so that the same value does not continue for a predetermined number of bits is assigned to the plurality of input terminals, wherein a first input terminal for preventing bit continuation for inserting "1" signals so that the value of "0" does not continue for a predetermined number of bits or a second input terminal for preventing bit continuation for inserting "0" signals so that the value of "1" does not continue for a predetermined number of bits is assigned as the input terminal for preventing bit continuation, wherein a terminal into which the binary signals are input, where the majority of a period is "0" value, is assigned as the second input terminal for preventing bit continuation, and wherein a terminal into which the binary signals are input, where the majority of a period is "1" value, is assigned as the first input terminal for preventing bit continuation.

* * * * *